April 16, 1968 L. W. PRIDDY 3,378,779
DEMODULATOR CIRCUIT WITH CONTROL FEEDBACK MEANS
Filed April 26, 1965
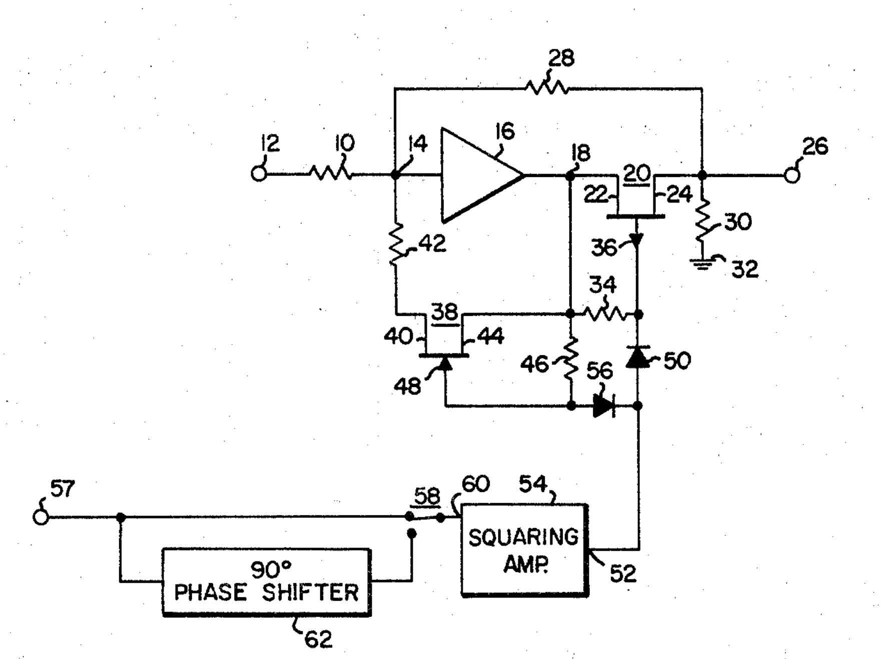
INVENTOR.
LLOYD W. PRIDDY
BY Bruce C Lutz
ATTORNEY 3,378,779
Patented Apr. 16, 1968

3,378,779
DEMODULATOR CIRCUIT WITH CONTROL FEEDBACK MEANS

Lloyd W. Priddy, Mahtomedi, Minn., assignor to Honeywell Inc., Minneapolis, Minn., a corporation of Delaware Filed Apr. 26, 1965, Ser. No. 450,936
10 Claims. (Cl. 329—101)

ABSTRACT OF THE DISCLOSURE

Demodulator circuitry with means for eliminating spikes at the output caused by switching and for reducing the output due to leakage while a demodulating switch is off by reducing an amplifier output through the use of an alternate feedback path inserted while the main feedback loop is open during the off times of the switch.

The present invention relates generally to demodulators and more particularly to an improved demodulator utilizing filed effect transistors. It has been old in the prior art to use various types of switches in series with an amplifier and to further have a feedback loop around the series combination of a switch and an amplifier to prevent offsets in the switch from producing a large effect on the output signal. However, this type of demodulator has suffered a defect in that a large spike has appeared at the output immediately after the series switch has turned to an ON condition and immediately prior to application of feedback through the feedback resistor to lower the output to the proper amplitude. A second defect in this type of demodulator is in the fact that unless the switch is a perfect switch i.e. infinite impedance in the open condition, there will be some leakage through the switch and there will be a resultant output across the load resistor. While field effect transistors being used as switches are very efficient in that their typical OFF impedance is 100 megohms, this would still provide a 100 microvolt output using a value of 1 kilohm for the output load resistance and an output of 10 volts for the amplifier. This large offset voltage would mean that the output could never be depended upon to be closer than 100 microvolts from the actual output signal. The present invention however will allow outputs with a much smaller tolerance than 100 microvolts and therefore produce a more accurate output.

The present invention comprises inserting a second switch between the output and the input of the amplifier which is in series with the demodulating switch. This second switch is turned ON while the series switch is turned OFF so that the output voltage amplitude from the amplifier is very low and thus there is very little leakage current flowing through the series switch and the load resistor to produce an output voltage. The second result of this low output voltage is that the amplitude of the output signal of the amplifier is very low when the series field effect transistor is switched ON and therefore there is no resultant spike appearing at the output of the demodulator.

It is therefore an object of this invention to provide an improved demodulator apparatus.

Further objects and advantages of the invention will be apparent through reading of the specification and appended claims along with the single FIGURE which is a combination schematic and block diagram of the circuitry utilized in practicing the invention.

A resistor 10 used for an input impedance is shown connected between an input terminal 12 and a junction point 14. A summing amplifier or high gain amplifier

16 is connected between junction point 14 and a junction point 18. A P-type channel field effect transistor 20 has a source 22 connected to junction point 18 and a drain 24 connected to an output terminal 26. A feedback resistor 28 is connected between output 26 and junction point 14 while a load resistor 30 is connected between input 26 and ground or reference potential 32. A bias resistor 34 is connected between gate 36 of transistor 20 and junction point 18. A complementary N-type channel field effect transistor 38 is shown with a drain 40 connected through a resistor 42 to junction point 14. Junction point 18 is connected to a source 44 of transistor 38. A bias resistor 46 is connected between junction point 18 and a gate 48 of transistor 38. While the two transistors have been described as field effect transistors, it will be realized that any type of switch may be utilized although the only place that the inventive concept would be necessary is where the switch 20 has less than infinite impedance in its OFF condition as far as leakage or output offset is concerned. However, the invention is still usable wherever the existence of spikes in the output is troublesome. In this light it is believed necessary and proper to include in the scope of designation of units 20 and 38 that they also be considered switch means, semiconductor means, and valve means. The diode 50 is connected between gate 36 and an output 52 of a squaring amplifier 54. A second diode 56 is connected between gate 48 and output 52 of squaring amplifier 54. Squaring amplifier 54 may be any type of amplifier which produces a square wave output but can be simply a saturating amplifier wherein the output quickly saturates with a small input voltage. Input terminal 57 is connected to one input of a switch 58 which has a movable contact connected to an input 60 of the squaring amplifier 54. A phase shifter 62 is connected between input 57 and a second terminal of switch 58. Upon operation of switch 58, the signal received by the squaring amplifier is changed from an in phase signal to a 90° phase shifted signal.

As explained briefly before an input signal applied to input 12 is amplified by amplifier 16 and, when switch 20 is in an ON condition, an output is obtained at output 26. The feedback resistor 28 determines the gain of the amplifier 16 and therefore determines the amplitude of the output signal relative to the input. As also mentioned previously, if switch 38 were deleted from the circuit, the gain of amplifier 16 would be very high if switch 20 were in an OFF condition so that there were no feedback around amplifier 16. Thus immediately upon turn ON of switch 20, the output at terminal 26 will be very high until this output is fed back through resistor 28 to bring the gain of amplifier 16 down to the predetermined amount. When the switch 58 is in the position shown, whereby a reference input signal from input 57 is applied directly to squaring amplifier 54, an output will be provided to turn switch 38 to an ON condition and simultaneously turn switch 20 to an OFF condition. A field effect transistor is turned to an ON condition by not applying an input to the gate 48. When the output from squaring amplifier 54 is positive, diode 56 is back biased. Resistor 46 is utilized to provide a discharge path for the small amount of internal capacitance in the field effect transistor 38. If resistor 46 were absent, it would take considerably longer time for this capacitive effect to disappear so that transistor 38 can turn ON to provide a feedback signal from junction point 18 to 14. Thus, bias resistor or capacitive resistor 46 is not necessary but is highly desirable. The resistor 42 is another resistor which is desirable in some instances but is not always necessary. Some amplifiers can be shorted from output to input and suffer no ill effects, however, other amplifiers must have some minimum resistance in the feedback loop or the amplifier performance will be degraded if not destroyed.

In many technical applications or uses merely requiring that the spikes in the output be at a minimum, the combined impedance of the transistor 38 in an ON condition and the impedance of resistor 42 will be approximately equal to the resistance of feedback resistor 28. Under these circumstances, the output at junction point 18 will allow the output potential to be at a voltage which will be exactly the same as when transistor 20 is turned ON and transistor 38 is turned OFF. Thus there will be no abrupt shift in the gain or amplifying characteristics of amplifier 16. However, under these conditions there will still be some leakage current through transistor 20 in the OFF condition and through the load resistor 30 to produce a small output. This output will not be detrimental for many applications of demodulator apparatus. However, in some instances where very low output tolerances are desired or necessary. the combined resistance of resistor 42 and switch 38 will be some minimum value which can be tolerated by amplifier 16 and under these conditions the output voltage at junction point 18 will be at a minimum during the OFF period of transistor 20 and therefore there will be an absolute minimum of leakage current through transistor 20 and load resistor 30.

As shown, the two transistors 20 and 38 are complementary transistors. By this it is meant that when a positive output signal is applied to the diodes 50 and 56, one of the transistors will turn ON while the other turns OFF. As previously mentioned, transistor 38 will turn ON. If an output at 52 of squaring amplifier 54 is now reversed to a negative potential, transistor 20 will turn ON due to the back biasing of diode 50 and transistor 38 will turn OFF since there will be current flow through diode 56 to the output of amplifier 54. This will result in the gate 48 of transistor 38 being back biased. The resistor 34 serves essentially the same type function as resistor 46 in that it reduces the capacitive discharge time of the internal capacitance of transistor 20.

While the squaring amplifier has been shown as having a single output in combination with complementary field effect transistors, it will be realized that the amplifier 54 could have two outputs one of which is 180° out of phase with the other. These two outputs could then be applied to similar type transistors in the positions shown for transistors 20 and 38 whereby one would turn OFF and the other one would turn ON simultaneously. Under this arrangement, the transistors could both be either P-channel type resistors or N-channel type transistors.

A 90° phase shifter 62 is shown with the switch 58. The purpose of the phase shifter is to allow demodulation in both the 0° reference phase and 90° reference phase so that the two components of the signal may be determined. From this information, it may be determined what the angle of the input signal is with respect to the reference signal. This information is very desirable in testing operations. As will be realized however this modification is not normally necessary in standard demodulation circuits.

While one specific embodiment of the invention has been shown and described, it will be realized that many modification may be made to those skilled in the art and I wish to be limited only by the appended claims wherein I claim:

1. Demodulating apparatus including input means, amplifier means, and output means wherein an electronic switch in series with the signal output interrupts a first feedback path connected between said output means and said input means when in an OFF condition and wherein the electronic switch in combination with the amplifier means introduces spikes of signal energy at said output means when first switched to an ON condition comprising, in addition:

valve means connected between the input means and a junction point between an output of the amplifier means and the electronic switch, said valve means providing a second feedback path, separate from said first feedback path, between the output and input of said amplifier means when in an ON condition, said valve means reducing the magnitude of the spikes; and reference signal supplying means connected to said electronic switch and to said valve means for applying signals thereto which will render one and then the other conductive in alternate half-cycles of the signal supplied by said reference signal supplying means.

2. Demodulating apparatus including input means, amplifier means, and output means wherein an electronic switch in series with the signal output is subject to leakage currents flowing therethrough when said eletcronic switch means is OFF due to an output signal applied thereto by said amplifier means comprising, in addition:

valve means connected between the input means and a junction point between an output of the amplifier means and the electronic switch, said valve means providing a feedback path connected between the output and input of said amplifier means when in an ON condition, said valve means reducing the leakage currents; and reference signal supplying means connected to said electronic switch and to said valve means for applying signals thereto which will render one and then the other conductive in alternate half-cycles of the signal supplied by said reference signal supplying means.

3. Demodulating apparatus including input means, amplifier means, and output means wherein an electronic switch in series with the signal output is subject to leakage currents flowing therethrough when said electronic switch means is OFF due to an output signal applied thereto by said amplifier means comprising, in addition:

field effect transistor switch means connected between the input means and a junction point between an output of the amplifier means and the electronic switch, said field effect transistor switch means providing a feedback path connected between the output and input of said amplifier means when in an ON condition, said valve means reducing the leakage currents; and reference signal supplying means connected to said electronic switch and to said field effect transistor switch means for applying signals thereto which will render one and then the other conductive in alternate half-cycles of the signal supplied by said reference signal supplying means.

4. Demodulating apparatus including input means, amplifier means, and output means wherein an electronic switch in series with the signal output interrupts a first feedback path connected between said output means and said input means when in an OFF condition and which introduces spikes of signal energy at said output means when first switched to an ON condition comprising, in addition:

field effect transistor switch means connected between the input means and a junction point between an output of the amplifier means and the electronic switch, said field effect transistor switch means providing a feedback path connected between the output input of said amplifier means when in an ON condition, said field effect transistor means reducing the magnitude of the spikes; and reference signal supplying means connected to said electronic switch and to said field effect transistor switch means for applying signals thereto which will render one and then the other conductive in alternate half-cycles of the signal supplied by said reference signal supplying means.

5. Half-wave demodulator apparatus comprising, in combination:

amplifier means including input means and output means;

means for supplying an input signal to be demodulated connected to said input means of said amplifier means;

demodulated signal output means;

means for supplying an alternating switching signal;

switch means connected between said amplifier output means and said demodulated signal output means and to said last named means for receiving the switching signal therefrom, the signal alternately rendering said switch means conductive and non-conductive in alternate half-cycles of said switching signal; and feedback means connacted between said output means of said amplifier means and said input means of said amplifier means only when said switch means is open.

6. Half-wave demodulator apparatus comprising, in combination:

amplifier means including input means and output means;

means for supplying an input signal to be demodulated connected to said input means of said amplifier means;

demodulated signal output means;

means for supplying a switching signal;

switch means connected between said amplifier output means and said demodulated signal output means and to said last named means for receiving the switching signal therefrom, the signal alternately rendering said switch means conductive and non-conductive in alternate half-cycles of said switching signal;

first feedback means connected between said demodulated signal output means and said input means of said amplifier means for minimizing errors introduced by said switch means; and second feedback means, separate from said first feedback means, connected between said output means of said amplifier means and said input means of said amplifier means only when said switch means is open.

7. Demodulating means including input, output, and reference signal means comprising, in combination:

amplifier means including input means and output means wherein said input means is connected to the input means of said demodulating means;

first valve means connected between said output means of said amplifier means and the output means of said demodulating means;

feedback means connected between the output means and the input means of said demodulating means, said feedback means minimizing any signal distortions introduced by said first valve means;

second valve means connected between said output means of said amplifier means and the input means of said demodulating means, said second valve means reducing the leakage current through said first valve means when said first valve means is in an OFF condition; and means connecting the reference signal means of said demodulating means to said first and second valve means, said first and second valve means alternately providing opposite conductivity states in accordance with a reference signal applied to the reference signal means for providing demodulation of a signal applied to the input means of the demodulating means.

8. Demodulating means including input means, output means, and reference signal means comprising, in combination:

amplifier means connected between the input means of said demodulating means and a junction means;

first switch means connected between said junction means and the output means of said demodulating means;

feedback means connected between the output means and the input means of said demodulating means, said feedback means minimizing any signal distortions introduced by said first switch means;

second switch means connected between said junction means and the input means of said demodulating means, said second switch means reducing the gain in said amplifier means when said second switch means is in an operative condition to reduce spike amplitudes appearing at said output means when said first switch means later becomes operative; and means connecting the reference signal means of said demodulating means to said first and second switch means, said first and second switch means switching to opposite conductivity states in accordance with a reference signal applied to the reference signal means to provide demodulation of a signal applied to the input means.

9. Demodulating means including input, output, and reference signal means comprising, in combination:

amplifier means connected between the input means of said demodulating means and a junction means;

first switch means connected between said junction means and the output means of said demodulating means;

feeback means connected between the output means and the input means of said demodulating means, said feedback means minimizing any signal distortions introduced by said first switch means;

second switch means connected between said junction means and the input means of said demodulating means, said second switch means reducing the gain of said amplifier means when said second switch means is in an operative condition; and means connecting the reference signal means of said demodulating means to said first and second switch means, said first and second switch means switching to opposite conductivity states in accordance with a reference signal applied to the reference signal means to provide demodulation of a signal applied to the input means.

10. Demodulating means including input, output, and reference signal means comprising, in combination:

high gain amplifier means connected between the input means of said demodulating means and a junction means;

first field effect transistor switch means connected between said junction means and the output means of said demodulating means;

feedback means connected between the output means and the input means of said demodulating means, said feedback means minimizing any signal distortions introduced by said first switch means;

second field effect transistor switch means connected between said junction means and the input means of said demodulating means, said second switch means being operable for reducing the output signal build-up in said amplifier means when said first switch means is in an inoperative condition; and means connecting the reference signal means of said demodulating means to said first and second switch means, said first and second switch means simultaneously switching to opposite conductivity states in accordance with a reference signal applied to the reference signal means to provide demodulation of a signal applied to the input means.

References Cited

UNITED STATES PATENTS

| | | | |
|---|---|---|---|
| 3,154,749 | 10/1964 | Perkins | 329—169 |
| 3,193,773 | 7/1965 | Uglum et al. | 330—10 |
| 3,225,216 | 12/1965 | Grabowski | 330—104 X |
| 3,229,218 | 1/1966 | Sickles et al. | 307—885 |
| 3,286,189 | 11/1966 | Mitchell et al. | 330—38 |

ALFRED L. BRODY, *Primary Examiner.*